US009666680B1

(12) United States Patent
Chang et al.

(10) Patent No.: US 9,666,680 B1
(45) Date of Patent: May 30, 2017

(54) FLASH CELL AND FORMING PROCESS THEREOF

(71) Applicant: UNITED MICROELECTRONICS CORP., Hsin-Chu (TW)

(72) Inventors: Yuan-Hsiang Chang, Hsinchu (TW); Shen-De Wang, Hsinchu County (TW); Chih-Chien Chang, Hsinchu (TW); Jianjun Yang, Singapore (SG); Aaron Chen, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 8 days.

(21) Appl. No.: 14/944,224

(22) Filed: Nov. 18, 2015

(51) Int. Cl.
| | | |
|---|---|---|
| H01L 29/788 | (2006.01) |
| H01L 29/423 | (2006.01) |
| H01L 29/66 | (2006.01) |
| H01L 21/28 | (2006.01) |
| H01L 21/265 | (2006.01) |
| H01L 21/321 | (2006.01) |
| H01L 21/223 | (2006.01) |
| H01L 21/285 | (2006.01) |
| H01L 21/3213 | (2006.01) |
| H01L 21/311 | (2006.01) |
| H01L 29/51 | (2006.01) |
| H01L 27/11521 | (2017.01) |

(52) U.S. Cl.
CPC ...... *H01L 29/42328* (2013.01); *H01L 21/223* (2013.01); *H01L 21/26586* (2013.01); *H01L 21/28273* (2013.01); *H01L 21/28562* (2013.01); *H01L 21/31111* (2013.01); *H01L 21/321* (2013.01); *H01L 21/32133* (2013.01); *H01L 27/11521* (2013.01); *H01L 29/42324* (2013.01); *H01L 29/513* (2013.01); *H01L 29/518* (2013.01); *H01L 29/6656* (2013.01); *H01L 29/66825* (2013.01); *H01L 29/788* (2013.01)

(58) Field of Classification Search
CPC ..................................................... H01L 27/108
USPC ........................................................ 257/318
See application file for complete search history.

(56) References Cited

U.S. PATENT DOCUMENTS

| | | | |
|---|---|---|---|
| 6,335,262 | B1 | 1/2002 | Crowder |
| 6,730,565 | B2 | 5/2004 | Cho |
| 7,180,127 | B2 | 2/2007 | Chen |
| 7,315,057 | B2 | 1/2008 | Jeon |
| 8,004,032 | B1 | 8/2011 | Bu |
| 8,377,774 | B2 | 2/2013 | Nagai |
| 2008/0099822 | A1 | 5/2008 | Yang |
| 2010/0255672 | A1 | 10/2010 | Kidokoro |

(Continued)

*Primary Examiner* — Elias M Ullah
(74) *Attorney, Agent, or Firm* — Winston Hsu; Scott Margo

(57) ABSTRACT

A flash cell includes a gate and an erase gate. The gate is disposed on a substrate, wherein the gate includes a control gate on the substrate and a floating gate having a tip between the substrate and the control gate. The erase gate is disposed beside the gate, wherein the tip points toward the erase gate. The present invention also provides a flash cell forming process including the following steps. A gate is formed on a substrate, wherein the gate includes a floating gate on the substrate. An implantation process is performed on a side part of the floating gate, thereby forming a first doped region in the side part. At least a part of the first doped region is oxidized, thereby forming a floating gate having a tip.

19 Claims, 5 Drawing Sheets

(56) References Cited

U.S. PATENT DOCUMENTS

2012/0164823 A1\* 6/2012 Nagai .................. H01L 27/115
                                                        438/593

\* cited by examiner

FLASH CELL AND FORMING PROCESS THEREOF

BACKGROUND OF THE INVENTION

1. Field of the Invention

The present invention relates generally to a flash cell and forming process thereof, and more specifically to a flash cell including a floating gate having a tip and forming process thereof.

2. Description of the Prior Art

Microprocessor systems are able to handle data and arrange information and have become an important asset in information development of the highly developed modern information society. One of the most important structures in each kind of microprocessor system is the memory used to store digital data and to provide stored data for microprocessor systems. A flash memory or an EEPROM (electrically erasable programmable read only memory), thanks to electron operation, is able to store data in a non-volatile way and to read the stored data quickly and efficiently, unlike optical or magnetic storage media (such as discs or optical discs). Therefore, flash memories with light volumes and convenient and efficient operations have been utilized widely in various microprocessor systems, such as application chip systems, mobile phones, personal digital assistants, personal computers, digital cameras, etc.

A flash memory consists of MOS transistors with a floating gate, each serving as a memory cell for recording a bit data. A typical memory transistor in addition to a body, a drain, a source, and a control gate as well as a typical MOS transistor, has a floating gate. The floating gate is located in an oxide layer, isolated from the body, the drain, the source, and the control gate. When storing data, proper bias voltages are required to be applied to the gate, the source, the drain, and the body so that the electrons can pass through the oxide layer and thus flow into the floating gate. A different amount of charges injected into the floating gate of the transistor corresponds to different data. For instance, if more charges are injected into the floating gate, the transistor stores a data bit "1"; on the contrary, if fewer charges are injected into the floating gate, the transistor stores a data bit "0". The amount of charges injected into the floating gate will influence the threshold voltage of the transistor. The more negative charges are injected into the floating gate of the transistor, the smaller the absolute value of the threshold voltage of the transistor is. Under the circumstance of keeping the control voltage applied on the control gate, the more negative charge within the floating gate is, the higher the conduct performance associated with the transistor is, so that the current between the source and drain of the transistor is greater. In other words, under the circumstance of keeping the control voltage applied on the control gate, the data bit stored in the transistor depends on the amount of conduct current in the transistor between its source and drain. While overwriting or erasing the original data stored in the memory transistor, the control gate, the body, the drain, and the source are still required to have proper bias voltages applied, causing the electrons within the floating gate to pass through the oxide layer and flow into other electrodes of the transistor.

SUMMARY OF THE INVENTION

The present invention provides a flash cell and forming process thereof, which includes a floating gate having a tip to improve erase efficiency.

The present invention provides a flash cell forming process including the following steps. A gate is formed on a substrate, wherein the gate includes a floating gate on the substrate. An implantation process is performed on a side part of the floating gate, thereby forming a first doped region in the side part. At least a part of the first doped region is oxidized, thereby a floating gate having a tip being formed.

The present invention provides a flash cell including a gate and an erase gate. The gate is disposed on a substrate, wherein the gate includes a control gate on the substrate and a floating gate having a tip between the substrate and the control gate. The erase gate is disposed beside the gate, wherein the tip points toward the erase gate.

According to the above, the present invention provides a flash cell and forming process thereof, which includes a gate disposed on a substrate, and the gate includes a floating gate having a tip pointing toward an erase gate beside the gate, thereby improving erase efficiency. Methods of forming the flash cell may include the following. A gate including a floating gate is formed on the substrate. An implantation process is performed on a side part of the floating gate, thereby a first doped region being formed in the side part. At least a part of the first doped region is oxidized, thereby the floating gate having the tip being formed. Thereafter, the erase gate is formed beside the gate.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-9 schematically depict cross-sectional views of a flash cell forming process according to an embodiment of the present invention. Please refer to FIGS. 1-3, where a gate 120 is formed on a substrate 110. The gate 120 may include a floating gate 122 on the substrate 110, and a control gate 124 on the floating gate 122.

Figure 1:
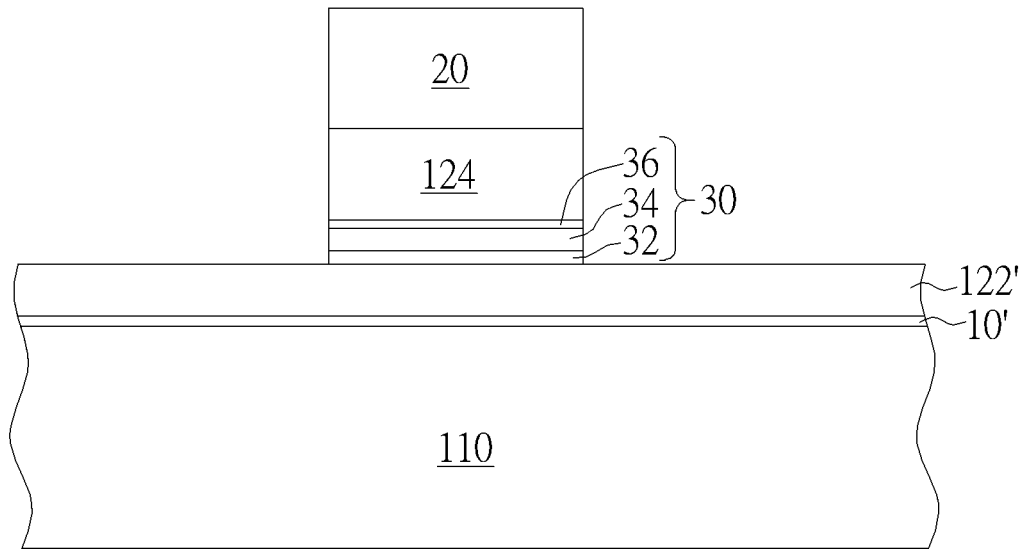
FIGS. 1-9 schematically depict cross-sectional views of a flash cell forming process according to an embodiment of the present invention.

More precisely, as shown in FIG. 1, the substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. A first dielectric layer 10', a floating gate layer 122', a second dielectric layer (not shown), a control gate layer (not shown) and a hard mask layer (not shown) may be sequentially formed on the substrate 110. Then, the hard mask layer, the control gate layer and the second dielectric layer may be patterned to form a hard mask 20, a control gate 124 and a second dielectric layer 30. In this embodiment, the hard mask layer, the control gate layer and the second gate layer are patterned without patterning the floating gate layer 122' and the first dielectric layer 10' for forming a floating gate protruding from the control gate 124. In this case, the first dielectric layer 10' may be an oxide layer formed by a thermal oxide process; the floating gate layer 122' and the control gate 124 may be formed by polysilicon; the second dielectric layer 30 may be an oxide/ nitride/oxide layer; the hard mask 20 may be a nitride layer, but they are not limited thereto.

Figure 2:
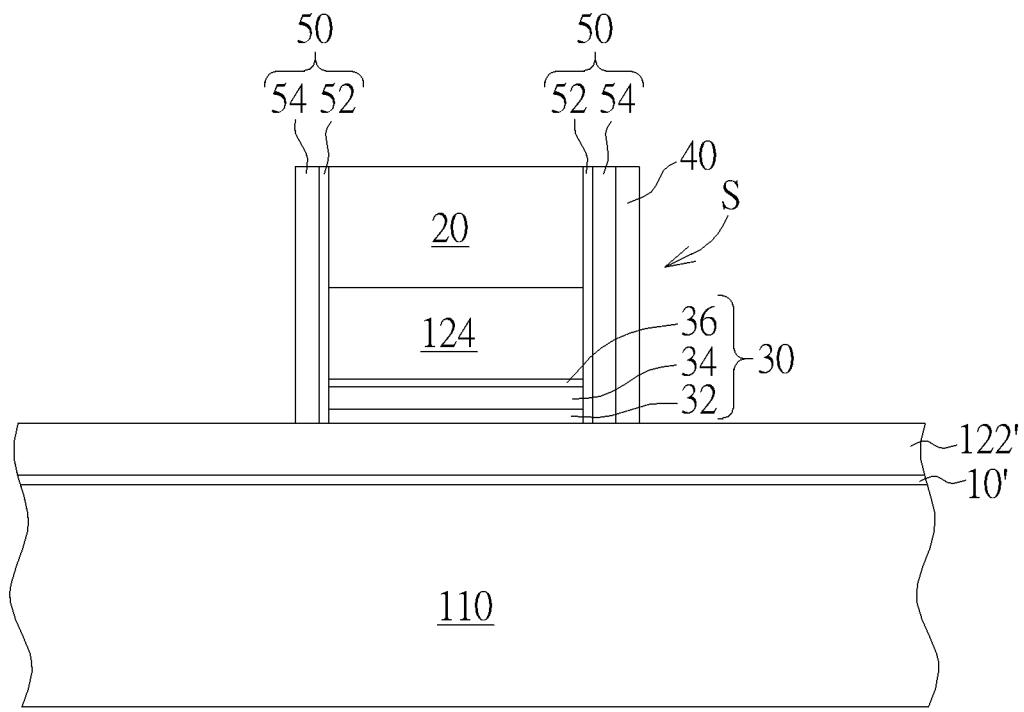

As shown in FIG. 2, inner spacers 50 are optionally formed at two sides of the second dielectric layer 30, the control gate 124 and the hard mask 20; a first spacer 40 is formed at only one (right) side of the second dielectric layer 30, the control gate 124 and the hard mask 20, thereby one of the inner spacers 50 being between the second dielectric layer 30/the control gate 124/the hard mask 20 and the first spacer 40. In this case, each of the inner spacers 50 is a dual spacer composed of an oxide spacer 52 and a nitride spacer 54, but it is not limited thereto. In other cases, each of the inner spacers 50 may be a single spacer or a multilayer spacer. The first spacer 40 is a single spacer composed of oxide, but it is not restricted thereto. In a preferred case, the inner spacers 50 and the first spacer 40 may be formed, but not limited to, the following. An inner spacer layer (not shown) including an oxide layer and an nitride layer from bottom to top and a first spacer layer (not shown) may sequentially and conformally cover the hard mask 20 and the floating gate layer 122', and then the first spacer layer and the inner spacer layer are patterned to form the inner spacers 50 and the first spacer 40 on both sides of the second dielectric layer 30, the control gate 124 and the hard mask 20. Thereafter, the first spacer 40 at one (left) side of the second dielectric layer 30, the control gate 124 and the hard mask 20 is removed. Therefore, a three-layer spacer includes the first spacer 40 and one of the inner spacers 50 only at one (right) side S of the second dielectric layer 30, the control gate 124 and the hard mask 20. Consequently, the three-layer spacer is an oxide/nitride/oxide spacer, while only the other inner spacer 50 is at the other (left) side of the second dielectric layer 30, the control gate 124 and the hard mask 20.

Figure 3:
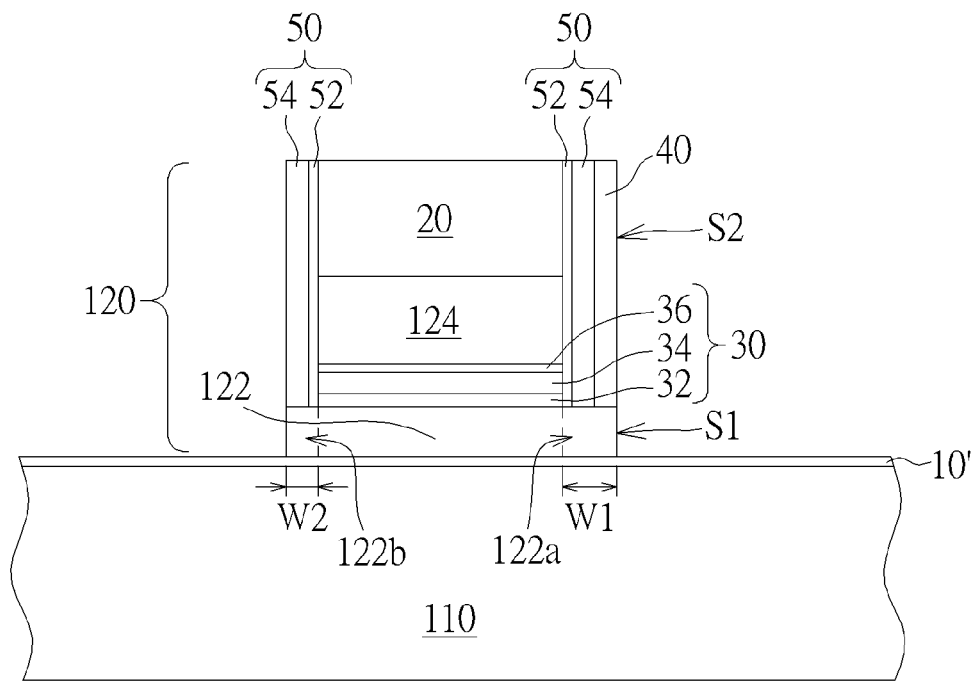

As shown in FIG. 3, the floating gate layer 122' is patterned by self-aligning the first spacer 40 at the right side and self-aligning the inner spacer 50 at the left side, thereby the floating gate 122 being formed. It is noted that, a sidewall S1 of the floating gate 122 trims with a sidewall S2 of the first spacer 40, while the first spacer 40 is only at a side of the control gate 124. In one case, the floating gate layer 122' may be patterned by a dry etching process for forming vertical sidewalls S1/S2, but it is not limited thereto. This means a side part 122a of the floating gate 122 protrudes from the control gate 124, and a protruding width w1 of the side part 122a is different from a protruding width w2 of the other side part 122b opposite to the side part 122a. That is, the protruding width w1 is larger than the protruding width w2 because of the first spacer 40 being only at one side of the control gate 124.

Figure 4:
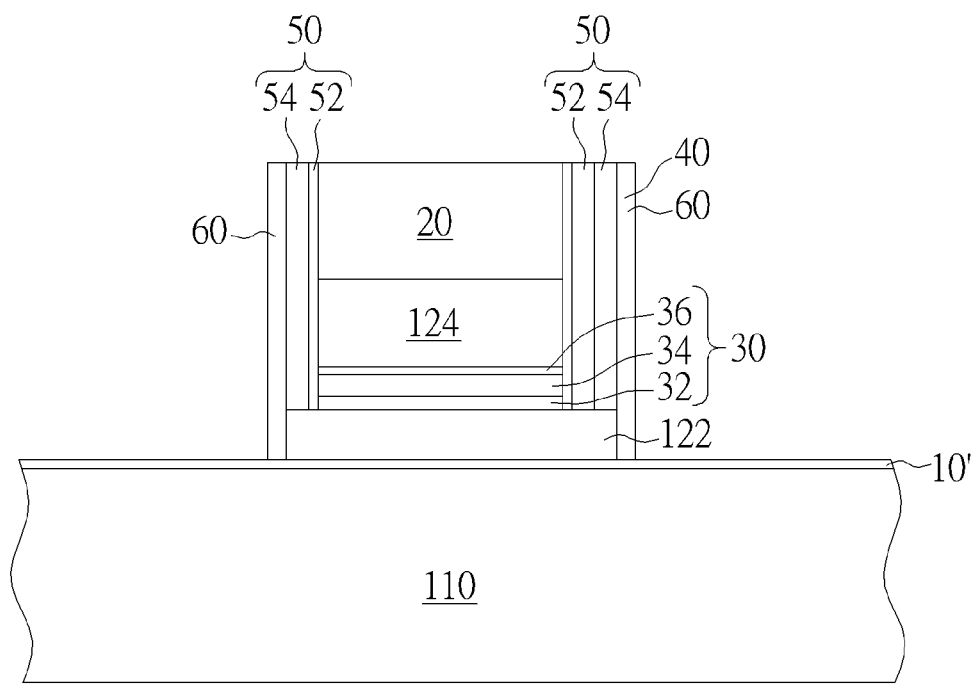

As shown in FIG. 4, second spacers 60 may be optionally formed beside the floating gate 124 to protect the floating gate 124 from being damaged during a later implantation process. In a preferred case, the second spacers 60 may be formed beside and contacts the floating gate 124 as well as the first spacer 40 at one side, and the inner spacer 50 in the other side to fully protect these components from being damaged, but it is not limited thereto. Meanwhile, the first dielectric layer 10' covers the substrate 110 to protect it. In this case, the second spacers 60 are oxide spacers, which may be formed by a high temperature oxide (HTO) process, but it is not limited thereto. It is noted that, the second spacers 60, the first dielectric layer 10' and the first spacer 40 are preferably composed of common materials to be removed simultaneously in later processes, but it is not limited thereto.

Figure 5:
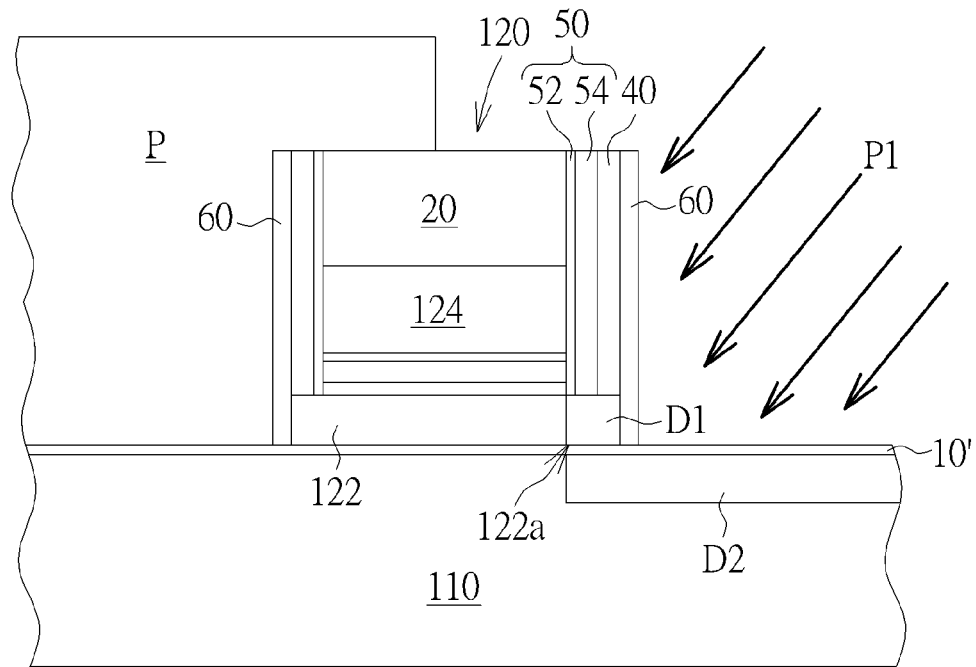

As shown in FIG. 5, a mask such as a photoresist P may cover the left side of the gate 120, and then an implantation process P1 can be performed only on the side part 122a of the floating gate 122, thereby a first doped region D1 being formed in the side part 122a. In this embodiment, a second doped region D2 is formed in the substrate 110 beside the floating gate 122 while the first doped region D1 is formed. Preferably, the first doped region D1 and the second doped region D2 are formed at the same time by one same implantation process P1. Preferably, the implantation process P1 may be a tilt implantation process, to form the doped regions such that the first doped region D1 and the second doped region D2 at the corner of the gate 120 and the substrate 110, but it is not limited thereto. Still preferably, the tilt implantation process P1 has a seven degree tilt angle with respect to a vertical direction, to form the doped regions precisely. The implantation process is preferably an arsenic implantation process, so that the first doped region D1 and the second doped region D2 can be oxidized more easily than other parts of the floating gate 122 and the substrate 110 in later performed processes, but it is not limited thereto.

Figure 6:
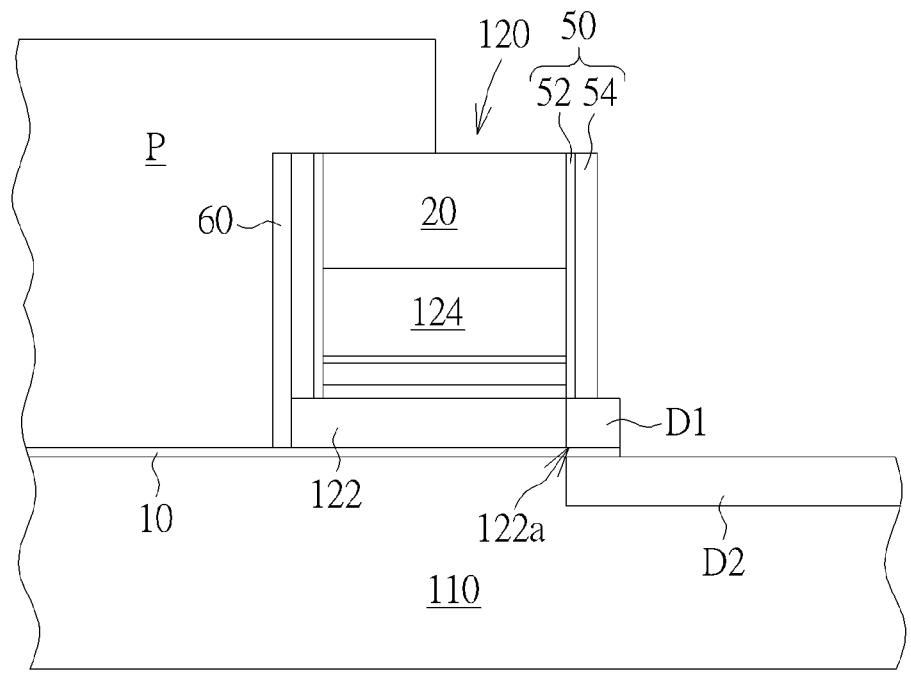

Thereafter, only one of the second spacers 60, the first spacer 40 and the first dielectric layer 10' at the right side of gate 120 are removed because the photoresist P still covers the left of the gate 120, thus the first doped region D1, the side part 122a of the floating gate 122 and the inner spacers 50 being exposed, and the first dielectric layer 10 remaining, as shown in FIG. 6. Methods of removing one of the second spacers 60, the first spacer 40 and the first dielectric layer 10' at the right side of the gate 120 may include performing an etching process such as a wet etching process containing dilute hydrofluoric acid (DHF) to remove one of the second spacers 60, the first spacer 40 and the first dielectric layer 10' all composed of oxide, but it is not limited thereto. Thereafter, the photoresist P is stripped.

Figure 7:
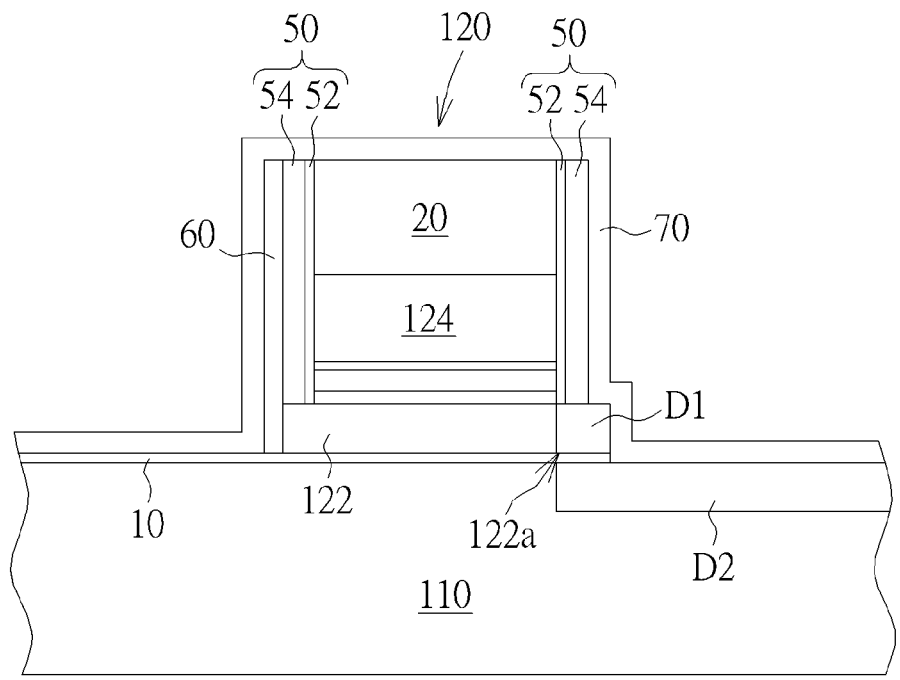

As shown in FIG. 7, a prevention layer 70 may be formed beside the floating gate 122 to prevent the floating gate 122 from being damaged during later oxidation processes. In this case, the prevention layer 70 blanketly and conformally covers the gate 120 and the substrate 110, but it is not limited thereto. In addition, the prevention layer 70 may only cover the floating gate 122. In one case, the prevention layer 70 is an oxide layer, which is formed by a high temperature oxide (HTO) process, but it is not restricted thereto. The prevention layer 70 cannot be formed by an oxidation process, thus the first doped region D1 and the second doped region D2 can be reserved without being consumed while performing the oxidation process.

Figure 8:
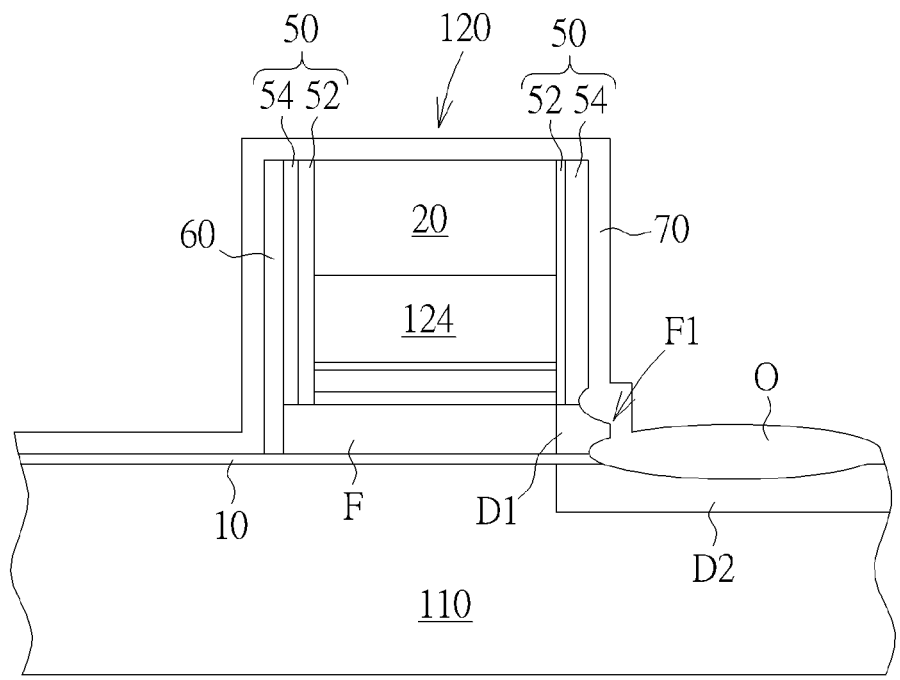

Thereafter, at least a part of the first doped region D1 is oxidized to form a floating gate F having a tip F1, as shown in FIG. 8. In this embodiment, the part of the first doped region D1 as well as a part of the second doped region D2 is oxidized, so that the floating gate F having the tip F1 in the first doped region D1 as well as a field oxide O in the second doped region D2 is formed. Due to the first doped region D1 protruding from the control gate 124, the tip F1 inherently protrudes from the control gate 124. In this embodiment, the tip F1 and the field oxide O are formed at the same time by one same oxidation process, wherein the oxidation process may be a dry oxidation process or a wet oxidation process such as a thermal oxidation process or others, and thus the field oxide O contacts the tip F1.

According to the above, the step of removing the second spacers 60, the first spacer 40 and the first dielectric layer 10' at the right side of gate 120 as shown in FIG. 6 and the step of forming the prevention layer 70 as shown in FIG. 7 may be omitted. That is, the second spacers 60, the first spacer 40 and the first dielectric layer 10' may be reserved to prevent the floating gate 122 from being damaged while oxidizing the first doped region D1 and the second doped region D2. Thus, this simplifies processing steps. In addition, as the step of removing the second spacers 60, the first spacer 40 and the first dielectric layer 10' at the right side of gate 120 as shown in FIG. 6 and the step of forming the prevention layer 70 as shown in FIG. 7 are carried out, device performance can be improved.

Figure 9:
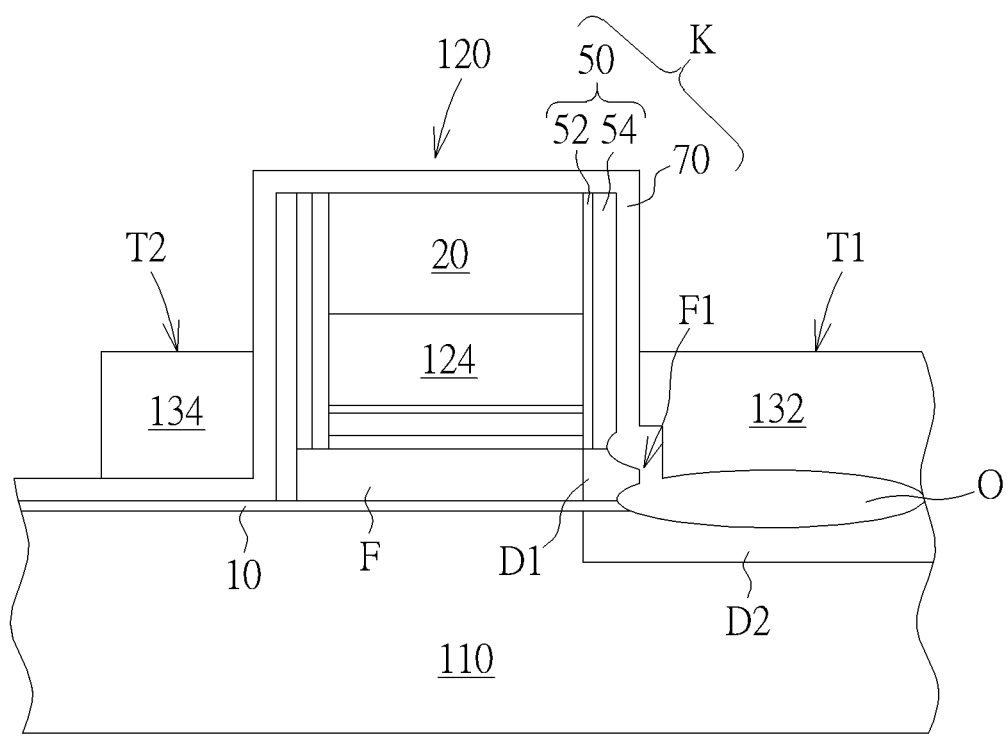

As shown in FIG. 9, an erase gate 132 is formed on the field oxide O beside the tip F1 and a selective gate 134 is formed on the first dielectric layer 10 beside the gate 120 opposite to the erase gate 132. In this embodiment, the erase gate 132 and the selective gate 134 are formed at the same time by one same process, but it is not limited thereto. For instance, a gate layer (not shown) such as a polysilicon layer conformally covers the gate 120 and the substrate 110, and then the gate layer is planarized, etched back and patterned to form the erase gate 132 and the selective gate 134, such that a top surface T1 of the erase gate 132 trims with a top surface T2 of the selective gate 134, but it is not limited thereto. It is emphasized that, the tip F1 points toward the erase gate 132, hence improving erase efficiency. Preferably, the erase gate 132 overlaps the tip F1 for erasing efficiently, but it is not limited thereto. Furthermore, the inner spacer 50 and the prevention layer 70 between the floating gate F and the erase gate 132 constitute a spacer K. As the inner spacer 50 includes the oxide spacer 52 and the nitride spacer 54 while the prevention layer 70 is an oxide layer, the spacer K is an oxide/nitride/oxide spacer, but it is not limited thereto.

It is emphasized that, a source (not shown) may be formed right below the erase gate 132 while a drain (not shown) is formed beside the selective gate 134. Therefore, the source and the drain are preferably formed at different processing steps. That is, the source is preferably formed before the erase gate 132 is formed because of the source being right below the erase gate 132, while the drain is formed after the selective gate 134 is formed because of the drain being beside the selective gate 134, but it is not restricted thereto.

To summarize, the present invention provides a flash cell and forming process thereof, which includes a gate disposed on a substrate, and the gate includes a floating gate having a tip pointing toward an erase gate beside the gate, thereby improving erase efficiency. Methods of forming the flash cell may include the following. A gate including a floating gate is formed on the substrate. An implantation process is performed on a side part of the floating gate, thereby a first doped region being formed in the side part. At least a part of the first doped region is oxidized, thereby the floating gate having the tip being formed. Thereafter, the erase gate is formed beside the gate.

Moreover, a second doped region may be formed in the substrate beside the side part of the floating gate while the first doped region is formed, therefore a field oxide may then be formed in the second doped region (that is, between the erase gate and the substrate) while the tip of the floating gate is formed by one same oxidation process. The implantation process is preferably a tilt implantation process, and still preferably has a seven degree tilt angle with respect to a vertical direction to dope at the corner of the floating gate and the substrate, meaning the side part of the floating gate and optionally in the substrate beside the floating gate, for forming the tip and optionally the field oxide. The implantation process is preferably an arsenic implantation process for oxidizing the first doped region and the second doped region more easily than other parts of the gate and the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash cell forming process, comprising:
   forming a gate on a substrate, wherein the gate comprises a floating gate on the substrate;
   performing an implantation process on a side part of the floating gate, thereby forming a first doped region in the side part;
   forming a second doped region in the substrate beside the floating gate while the first doped region is formed; and
   oxidizing at least a part of the first doped region, thereby forming a floating gate having a tip.

2. The flash cell forming process according to claim 1, wherein the implantation process comprises a tilt implantation process.

3. The flash cell forming process according to claim 2, wherein the tilt implantation process has a seven degree tilt angle with respect to a vertical direction.

4. The flash cell forming process according to claim 1, wherein the implantation process comprises an arsenic implantation process.

5. The flash cell forming process according to claim 1, further comprising:
   forming a field oxide in the second doped region while the tip is formed by oxidizing the first doped region.

6. The flash cell forming process according to claim 1, further comprising:
   forming an erase gate beside the tip after oxidizing the part of the first doped region, wherein the tip points toward the erase gate.

7. The flash cell forming process according to claim 6, further comprising:
   forming a selective gate beside the gate opposite to the erase gate while the erase gate is formed.

8. The flash cell forming process according to claim 1, wherein the step of forming the gate comprises:
   sequentially forming a floating gate layer and a control gate layer on the substrate;
   patterning the control gate layer to form a control gate;
   forming a first spacer at a side of the control gate; and
   patterning the floating gate layer by self-aligning the first spacer, thereby the floating gate being formed, and the side part of the floating gate protruding from the control gate, wherein the floating gate has different protruding widths at the side part and the other side part opposite to the side part.

9. The flash cell forming process according to claim 8, wherein the first doped region and the tip in the side part of the floating gate protrude from the control gate.

10. The flash cell forming process according to claim 8, further comprising:
    forming an inner spacer beside the gate before the first spacer is formed, thereby the inner spacer being between the first spacer and the gate, wherein the inner spacer and the first spacer constitute an oxide/nitride/oxide spacer.

11. The flash cell forming process according to claim 1, further comprising:
    forming a second spacer beside the floating gate after the gate is formed and before the implantation process is performed.

12. The flash cell forming process according to claim 11, further comprising:

removing the second spacer after the implantation process is performed.

13. The flash cell forming process according to claim 1, further comprising:

forming a prevention layer beside the floating gate after the implantation process is performed and before the part of the first doped region is oxidized.

14. A flash cell, comprising:

a gate disposed on a substrate, wherein the gate comprises a control gate on the substrate and a floating gate having a tip between the substrate and the control gate; and an erase gate disposed beside the gate, wherein the tip points toward the erase gate.

15. The flash cell according to claim 14, wherein the tip protrudes from a side of the control gate.

16. The flash cell according to claim 14, wherein the gate comprises a first dielectric layer between the floating gate and the substrate, and a second dielectric layer between the control gate and the floating gate, wherein the second dielectric layer comprises an oxide/nitride/oxide layer.

17. The flash cell according to claim 14, further comprising:

a first doped region containing the tip located in a side part of the floating gate and a second doped region in the substrate beside the side part.

18. The flash cell according to claim 14, further comprising:

a field oxide disposed beside the floating gate and contacting the tip.

19. The flash cell according to claim 14, further comprising:

a spacer disposed between the floating gate and the erase gate, wherein the spacer is an oxide/nitride/oxide spacer.

* * * * *